(12) United States Patent
Yeh

(10) Patent No.: US 10,964,353 B2
(45) Date of Patent: Mar. 30, 2021

(54) ELECTRONIC DEVICE WITH DETACHABLE STRUCTURE AND MODULE FRAME THEREOF

(71) Applicant: Wiwynn Corporation, New Taipei (TW)

(72) Inventor: Ping Sheng Yeh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/287,633

(22) Filed: Feb. 27, 2019

(65) Prior Publication Data

US 2020/0090706 A1    Mar. 19, 2020

(30) Foreign Application Priority Data

Sep. 14, 2018  (TW) .................................. 107132724

(51) Int. Cl.
  *H05K 5/00*      (2006.01)
  *G11B 33/02*     (2006.01)
  *H05K 5/02*      (2006.01)
  *H01R 13/639*    (2006.01)

(52) U.S. Cl.
  CPC ......... *G11B 33/022* (2013.01); *H05K 5/0221* (2013.01); *H01R 13/639* (2013.01)

(58) Field of Classification Search
  CPC ...................................................... H05K 5/00
  See application file for complete search history.

(56) References Cited

U.S. PATENT DOCUMENTS

| | | | |
|---|---|---|---|
| 8,035,961 B2* | 10/2011 | Figuerado ............... | G06F 1/187 361/679.37 |
| 8,456,832 B1* | 6/2013 | Brigham, Jr. ........... | G06F 1/187 361/679.33 |
| 2017/0094828 A1* | 3/2017 | Van Pelt .................. | H05K 7/18 |
| 2018/0146569 A1* | 5/2018 | Schroeder ............ | G11B 33/027 |

FOREIGN PATENT DOCUMENTS

| CN | 1756466 A | 4/2006 |
|---|---|---|
| CN | 101221459 A | 7/2008 |
| CN | 101923884 B | 12/2010 |
| CN | 106951036 A | 7/2017 |
| CN | 108241412 A | 7/2018 |
| CN | 208271106 U | 12/2018 |

* cited by examiner

*Primary Examiner* — Jerry Wu

(57) ABSTRACT

An electronic device with a detachable structure is provided. The electronic device includes a bracket, a connector, a module frame and a carried unit. The bracket includes a bracket wedging portion, wherein the bracket has a receiving recess, the receiving recess has a first side and a second side, the first side is opposite to the second side, and the bracket wedging portion is located on the first side. The connector is disposed on the second side of the bracket. The module frame is detachably connected to the bracket. The module frame can be easily attached to or detached from the bracket, reducing the time and effort required for assembly.

11 Claims, 21 Drawing Sheets

ELECTRONIC DEVICE WITH DETACHABLE STRUCTURE AND MODULE FRAME THEREOF

CROSS REFERENCE TO RELATED APPLICATIONS

This Application claims priority of Taiwan Patent Application No. 107132724, filed on Sep. 14, 2018, the entirety of which is incorporated by reference herein.

BACKGROUND OF THE INVENTION

Field of the Invention

Embodiments of the present invention relate to an electronic device, and in particular to an electronic device with detachable structure.

Description of the Related Art

Conventionally, hard disks are affixed to electronic devices (such as computers and servers) using screws. However, to affix a hard disk to an electronic device with screws, additional operation space around the hard disk is required, allowing the screw driver enough space to turn the screws. The space inside the electronic device is therefore not used efficiently. Additionally, the procedure for affixing a hard disk to an electronic device using screws is complicated and requires time and effort.

BRIEF SUMMARY OF THE INVENTION

In one embodiment, a module frame for carrying a carried unit and being detachably connected to a bracket of an electronic device is provided. The module frame comprises a frame body, a frame latch and a supporting plate. The frame latch is disposed on the frame body, wherein in a fastened state, the frame latch wedges the bracket, and in a released state, the frame latch is separated from the bracket. The supporting plate is connected to the frame body.

In one embodiment, the frame body comprises a U-shaped member and a side member, one end of the side member pivots on one end of the U-shaped member, the other end of the side member is detachably connected to the other end of the U-shaped member, and the frame latch is disposed on the U-shaped member.

In one embodiment, the supporting plate is connected to the U-shaped member.

In one embodiment, the module frame further comprises a first light guide strip, wherein the first light guide strip is disposed on the supporting plate, and is located between the carried unit and the supporting plate.

In one embodiment, the module frame further comprises a second light guide strip and a light blocking strip, wherein the second light guide strip and the light blocking strip are disposed on the supporting plate, the second light guide strip and the light blocking strip are located between the carried unit and the supporting plate, and the light blocking strip is located between the first light guide strip and the second light guide strip.

In one embodiment, an electronic device with a detachable structure is provided. The electronic device comprises a housing and a carrier plate. The housing comprises a first wedging slot. The carrier plate is detachably connected to the housing, wherein the carrier plate comprises a carrier plate body and a carrier plate latch, the carrier plate latch is disposed on the carrier plate body, the carrier plate latch is moved between a first carrier plate latch position and a second carrier plate latch position, when the carrier plate latch is in the first carrier plate latch position, the carrier plate latch wedges the first wedging slot, and when the carrier plate latch is in the second carrier plate latch position, the carrier plate latch is separated from the first wedging slot.

In one embodiment, the electronic device further comprises a mainboard, wherein the mainboard is disposed on the carrier plate body.

In one embodiment, the carrier plate latch pivots between the first carrier plate latch position and the second carrier plate latch position.

In one embodiment, the carrier plate further comprises an elastic recovering unit, the elastic recovering unit is disposed on the carrier plate body, and when the carrier plate latch is in the second carrier plate latch position, the elastic recovering unit provides an elastic force to the carrier plate latch to move the carrier plate latch back to the first carrier plate latch position.

In one embodiment, the electronic device further comprises a bracket and a plurality of module frames, the bracket and the module frames are disposed on the carrier plate body.

In one embodiment, the carrier plate further comprises at least one carrier plate elastic sheet, the carrier plate elastic sheet is disposed on the carrier plate body, the carrier plate is moved between a first carrier plate position and a second carrier plate position relative to the housing, when the carrier plate is in the first carrier plate position, the carrier plate latch wedges the first wedging slot, and when the carrier plate is in the second carrier plate position, the carrier plate is partially out of the housing, and the carrier plate elastic sheet wedges the first wedging slot.

In one embodiment, the carrier plate elastic sheet comprises a first elastic sheet hook, one end of the carrier plate elastic sheet is connected to the carrier plate body, the first elastic sheet hook is disposed on the other end of the carrier plate elastic sheet, and when the carrier plate is in the second carrier plate position, the first elastic sheet hook wedges the first wedging slot.

In one embodiment, the housing further comprises a second wedging slot, the carrier plate elastic sheet comprises a second elastic sheet hook, when the carrier plate is in the first carrier plate position, the second wedging slot is empty, and when the carrier plate is in the second carrier plate position, the second elastic sheet hook wedges the second wedging slot.

In one embodiment, the carrier plate elastic sheet further comprises an elastic sheet pressing portion, and the elastic sheet pressing portion protrudes from an elastic sheet surface of the carrier plate elastic sheet.

In one embodiment, the electronic device further comprises a label carrier, wherein the label carrier is disposed in the housing, and is located between the housing and the carrier plate.

In one embodiment, the label carrier pivots on the housing.

In one embodiment, an electronic device with a detachable structure is provided. The electronic device comprises a bracket, a connector, a module frame and a carried unit. The bracket comprises a bracket wedging portion, wherein the bracket has a receiving recess, the receiving recess has a first side and a second side, the first side is opposite to the second side, and the bracket wedging portion is located on the first side. The connector is disposed on the second side of the bracket. The module frame is detachably connected to the bracket, wherein the module frame comprises a frame latch, in a fastened state, the module frame is in the receiving recess, and the frame latch wedges the bracket wedging portion, and in a released state, the frame latch is separated from the bracket wedging portion, and the module frame is adapted to be separated from the receiving recess. The carried unit is disposed in the module frame, wherein in the fastened state, the carried unit is connected to the connector.

In one embodiment, the frame latch is adapted to be moved between a first frame latch position and a second frame latch position, and when the frame latch is in the first frame latch position, the frame latch wedges the bracket wedging portion, and when the frame latch is in the second frame latch position, the frame latch is separated from the bracket wedging portion.

In one embodiment, the frame latch comprises a rod portion and a frame latch wedging portion, the module frame further comprises a frame latch chamber, the frame latch is partially located in the frame latch chamber and is adapted to be moved in the frame latch chamber, the rod portion and the frame latch wedging portion protrude out of the frame latch chamber, and the frame latch wedging portion is adapted to wedge the bracket wedging portion.

In one embodiment, the frame latch wedging portion has a frame latch inclined surface, and when the module frame is pressed into the receiving recess, the bracket wedging portion pushes the frame latch inclined surface, and moves the frame latch toward the second frame latch position.

In one embodiment, the module frame further comprises an elastic element, one end of the elastic element abuts the frame latch, the other end of the elastic element abuts an inner wall of the frame latch chamber, and when the frame latch is in the second frame latch position, the elastic element provides an elastic force on the frame latch to move the frame latch back to the first frame latch position.

In one embodiment, the module frame comprises a U-shaped member and a side member, one end of the side member pivots on one end of the U-shaped member, the other end of the side member is detachably connected to the other end of the U-shaped member, and the frame latch is disposed on the U-shaped member.

In one embodiment, the U-shaped member includes an elastic arm, the free end of the elastic arm comprises an elastic arm wedging portion, the side member comprises a side member wedging portion, and the side member wedging portion is detachably connected to the elastic arm wedging portion.

In one embodiment, the carried unit comprises a plurality of thread holes, the module frame comprises a plurality of frame protrusions, at least one of the frame protrusions is formed on the U-shaped frame, at least one of the frame protrusions is formed on the side member, and the frame protrusions wedge the thread holes.

In one embodiment, the module frame further comprises a shaft and a torsion spring, the side member pivots on the U-shaped member via the shaft, the torsion spring is telescoped on the shaft, one end of the torsion spring abuts the side member, and the other end of the torsion spring abuts the U-shaped frame.

In one embodiment, the module frame comprises an L-shaped member, the L-shaped member comprises a first section, a second section and an abutting portion, the frame latch is disposed on the first section, one end of the second section pivots on the first section, the abutting portion is formed on the other end of the second section, and the abutting portion is perpendicular to the second section.

In one embodiment, the carried unit comprises a plurality of thread holes, the module frame comprises a plurality of frame protrusions, at least one of the frame protrusions is formed on the second section, and the frame protrusions wedge the thread holes.

In one embodiment, the module frame further comprises a shaft and a torsion spring, the second section pivots on the first section via the shaft, the torsion spring is telescoped on the shaft, one end of the torsion spring abuts the second section, and the other end of the torsion spring abuts the first section.

In one embodiment, the bracket comprises a first plate, a second plate and two spacers, the first plate is perpendicular to the second plate, the bracket wedging portion is disposed on the first plate, the connector is disposed on the second plate, the spacers are perpendicular to the first plate and perpendicular to the second plate, the receiving recess is defined between the spacers, each spacer comprises at least one restriction portion, and the restriction portion corresponds to the first plate.

In one embodiment, the electronic device further comprises a plurality of elastic strips, wherein the elastic strips are attached to the first plate and adapted to abut the carried unit.

Utilizing the electronic device of the embodiment of the invention, the carried unit (such as hard disk) is disposed in the module frame, and the module frame is detachably connected to the bracket by a frame latch. Therefore, the carried unit is affixed by wedging rather than by screws. The carried unit can be tightly arranged with other elements inside the electronic device, and no additional fastening-operation space is required. The space inside the electronic device can be utilized efficiently. Additionally, the module frame can be separated from the bracket via the frame latch, the module frame can be easily attached to or detached from the bracket, reducing the time and effort required for assembly.

In one embodiment of the invention, the module frame wedges the thread holes on the surface of the carried unit (such as hard disk). The module frame can be affixed to the carried unit (such as hard disk) without screws. The carried unit (such as hard disk) therefore can be easily removed from the module frame without additional tools (such as screw driver).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
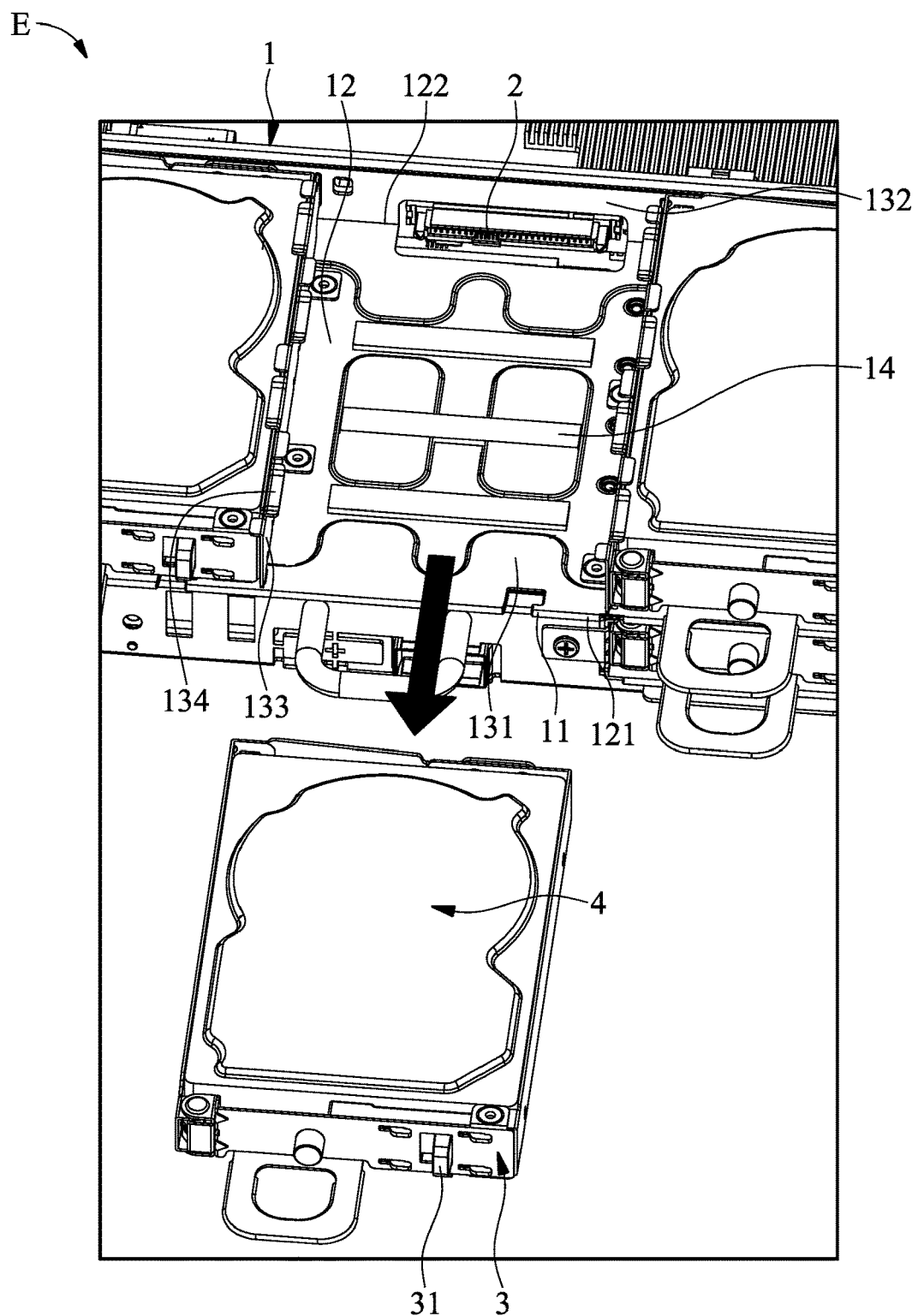
FIG. 1 shows an electronic device with a detachable structure of an embodiment of the invention.
Figure 2A:
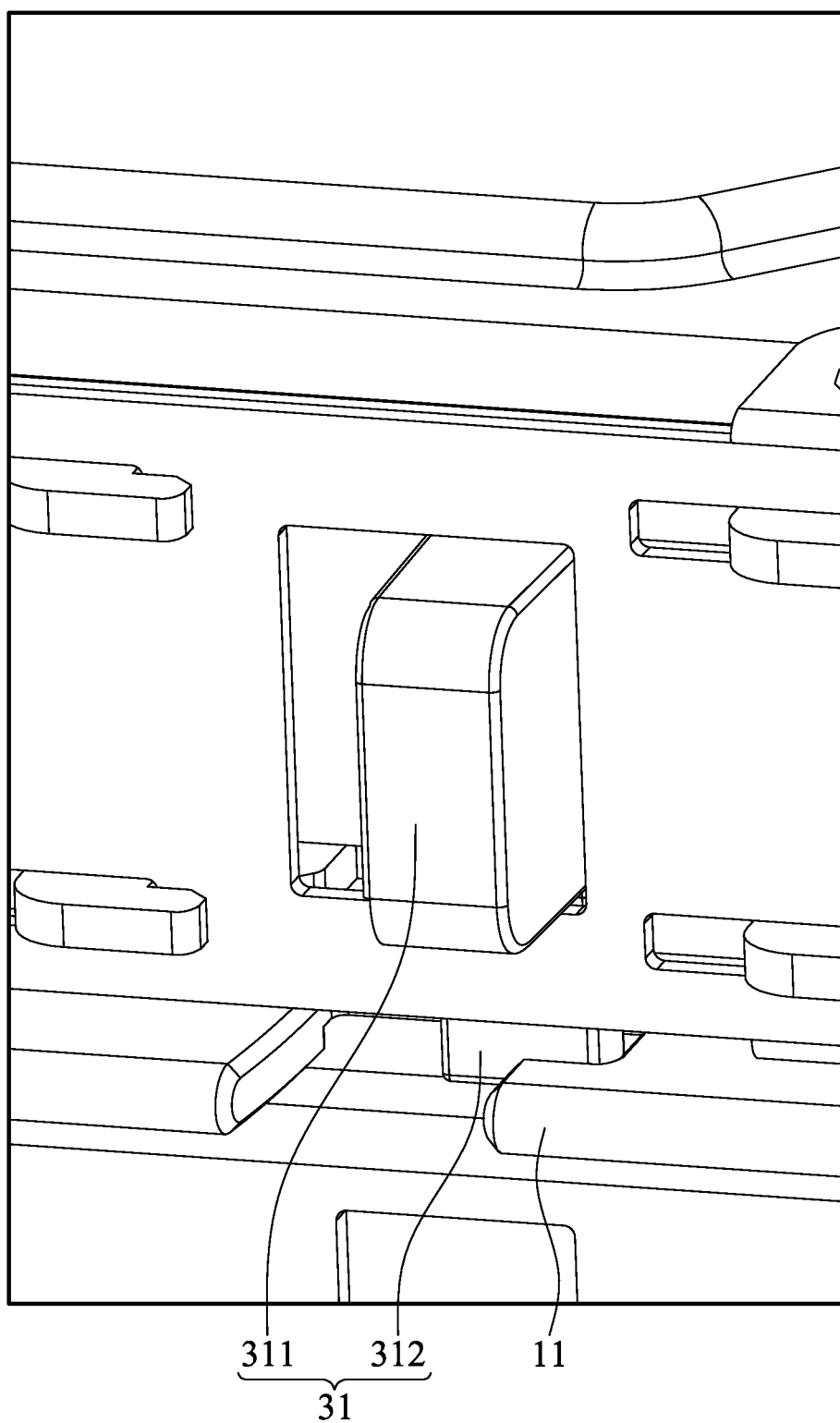
FIG. 2A shows a frame latch of the embodiment of the invention, wherein the frame latch is in a first frame latch position.
Figure 2B:
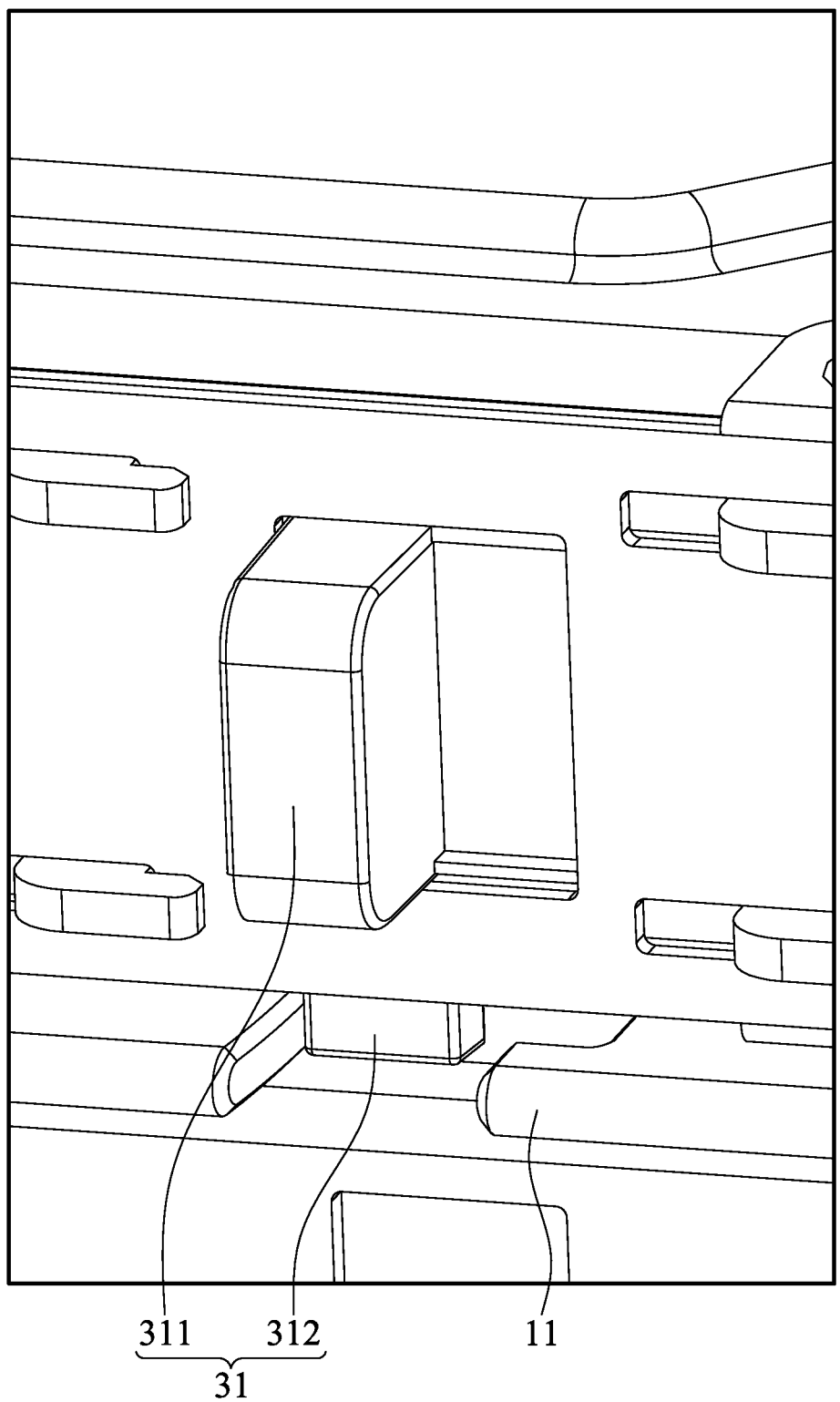
FIG. 2B shows the frame latch of the embodiment of the invention, wherein the frame latch is in a second frame latch position.

FIG. 1 shows an electronic device E with a detachable structure of the embodiment of the invention. With reference to FIG. 1, the electronic device E includes a bracket 1, a connector 2, a module frame 3 and a carried unit 4. The bracket 1 comprises a bracket wedging portion 11. The bracket 1 has a receiving recess 12. The receiving recess 12 has a first side 121 and a second side 122. The first side 121 is opposite to the second side 122. The bracket wedging portion 11 is located on the first side 121. The connector 2 is disposed on the second side 122 of the bracket 1. The module frame 3 is detachably connected to the bracket 1. The module frame 3 comprises a frame latch 31. With reference to FIG. 2A, in a fastened state, the module frame 3 is in the receiving recess 12. The frame latch 31 wedges the bracket wedging portion 11. With reference to FIG. 2B, in a released state, the frame latch 31 is separated from the bracket wedging portion 11, and the module frame 3 is adapted to be separated from the receiving recess 12. The carried unit 4 is disposed in the module frame 3. In the fastened state, the carried unit 4 is connected to the connector 2. In one embodiment, the carried unit 4 can be a hard disk or other storage device.

With reference to FIGS. 2A and 2B, in one embodiment, the frame latch 31 is adapted to be moved between a first frame latch position (FIG. 2A) and a second frame latch position (FIG. 2B). When the frame latch 31 is in the first frame latch position (FIG. 2A), the frame latch 31 wedges the bracket wedging portion 11. When the frame latch 31 is in the second frame latch position (FIG. 2B), the frame latch 31 is separated from the bracket wedging portion 11.

Figure 3A:
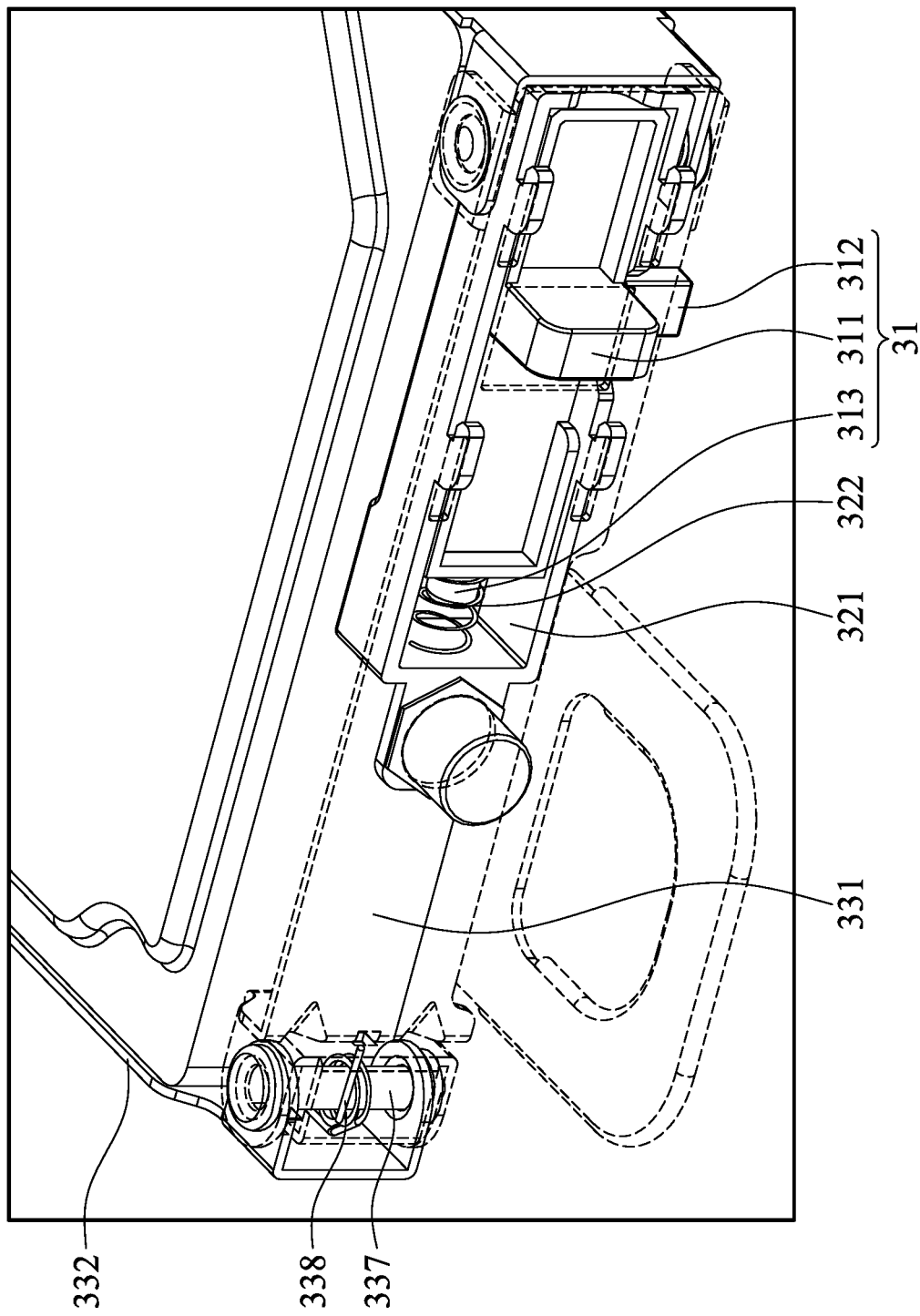
FIG. 3A shows an elastic element of the embodiment of the invention.

With reference to FIG. 3A, in one embodiment, the frame latch 31 comprises a rod portion 311 and a frame latch wedging portion 312. The module frame 3 further comprises a frame latch chamber 321. The frame latch 31 is partially located in the frame latch chamber 321 and is adapted to be moved in the frame latch chamber 321. The rod portion 311 and the frame latch wedging portion 312 protrude out of the frame latch chamber 321, and the frame latch wedging portion 312 is adapted to wedge the bracket wedging portion 11. In one embodiment, the frame latch chamber 321 can be affixed to the module frame 3 by rivets or screws.

With reference to FIG. 3A, in one embodiment, the module frame 3 further comprises an elastic element 322. One end of the elastic element 322 abuts the frame latch 31. The other end of the elastic element 322 abuts an inner wall of the frame latch chamber 321. When the frame latch 31 is in the second frame latch position, the elastic element 322 provides an elastic force on the frame latch 31 to move the frame latch 31 back to the first frame latch position. With reference to FIG. 3A, in this embodiment, the frame latch 31 further comprises a frame latch post 313. The elastic element 322 is partially telescoped on the frame latch post 313. The disclosure is not meant to restrict the invention. For example, in one embodiment, the elastic element 322 can be omitted. The frame latch 31 can be moved to the first frame latch position manually.

Figure 3B:
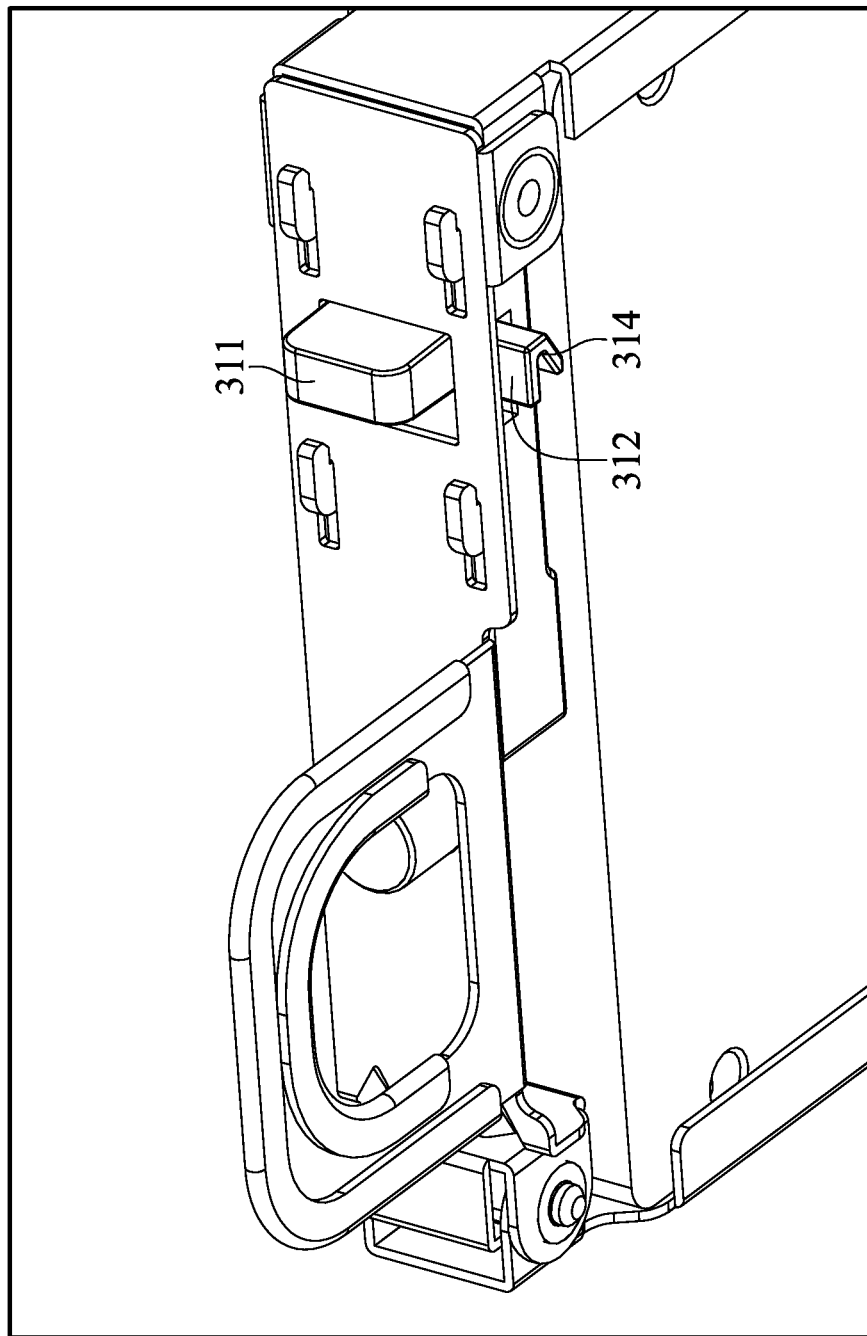
FIG. 3B shows a frame latch inclined surface of the embodiment of the invention.

With reference to FIG. 3B, in one embodiment, the frame latch wedging portion 312 has a frame latch inclined surface 314. When the module frame 3 is pressed into the receiving recess 12, the bracket wedging portion 11 pushes the frame latch inclined surface 314, and moves the frame latch 31 toward the second frame latch position. Therefore, the module frame 3 can be smoothly pressed into the receiving recess 12.

Utilizing the electronic device E of the embodiment of the invention, the carried unit 4 (such as hard disk) is disposed in the module frame 3, and the module frame 3 is detachably connected to the bracket 1 by a frame latch 31. Therefore, the carried unit 4 is affixed by wedging rather than by screws. The carried unit 4 can be tightly arranged with other elements inside the electronic device E, and no additional fastening-operation space is required. The space inside the electronic device E can be utilized efficiently. Additionally, the module frame 3 can be separated from the bracket 1 via the frame latch 31, the module frame 3 can be easily attached to or detached from the bracket 1, and the time and effort required for assembly are reduced.

Figure 4A:
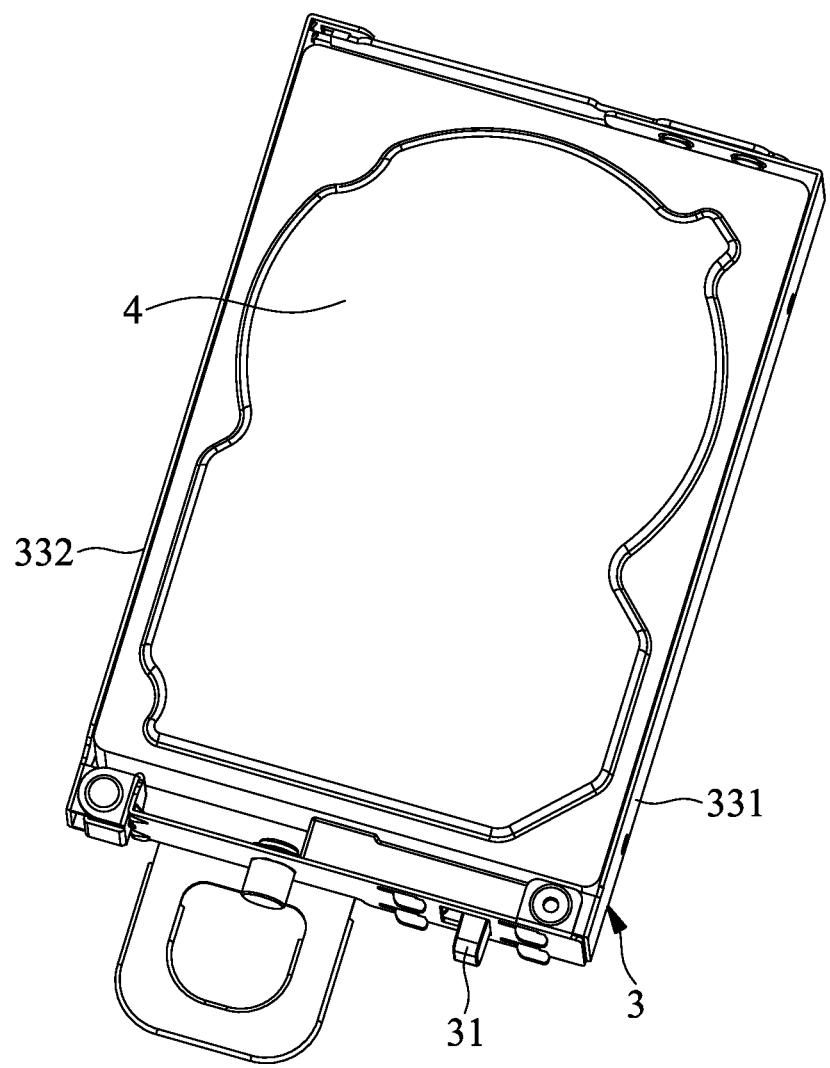
FIGS. 4A and 4B show a module frame of the embodiment of the invention.
Figure 4B:
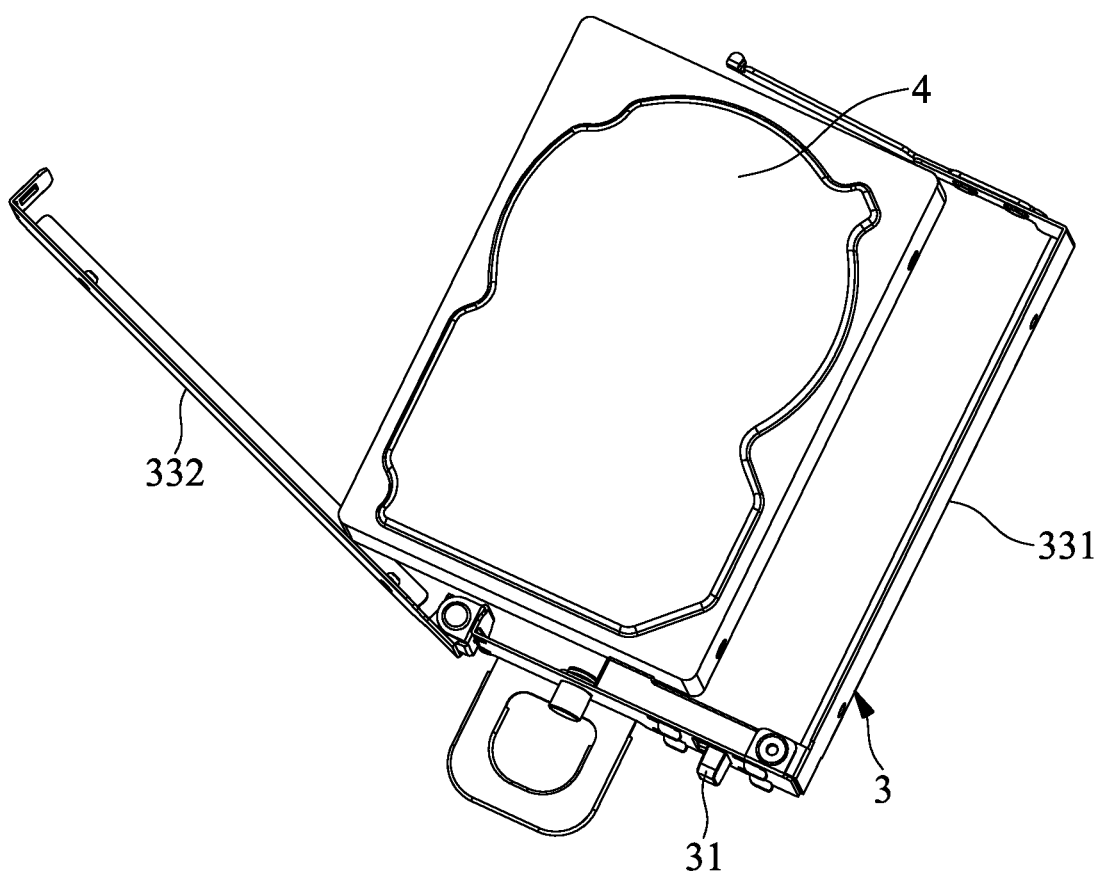

With reference to FIGS. 4A and 4B, in one embodiment, the module frame 3 comprises a U-shaped member 331 and a side member 332. One end of the side member 332 pivots on one end of the U-shaped member 331. The other end of the side member 332 is detachably connected to the other end of the U-shaped member 331. The frame latch 31 is disposed on the U-shaped member 331. With reference to FIG. 4B, after the end of the side member 332 is separated from the U-shaped member 331, the carried unit 4 can be easily detached.

Figure 4C:
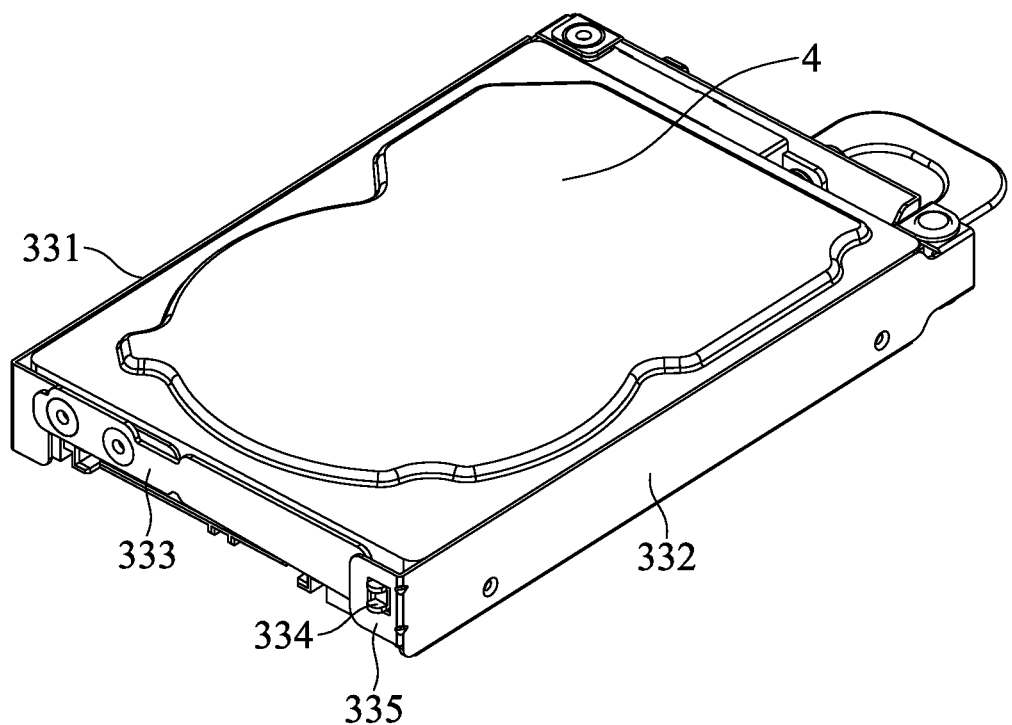
FIGS. 4C and 4D show an elastic arm of a U-shaped member of the embodiment of the invention.
Figure 4D:
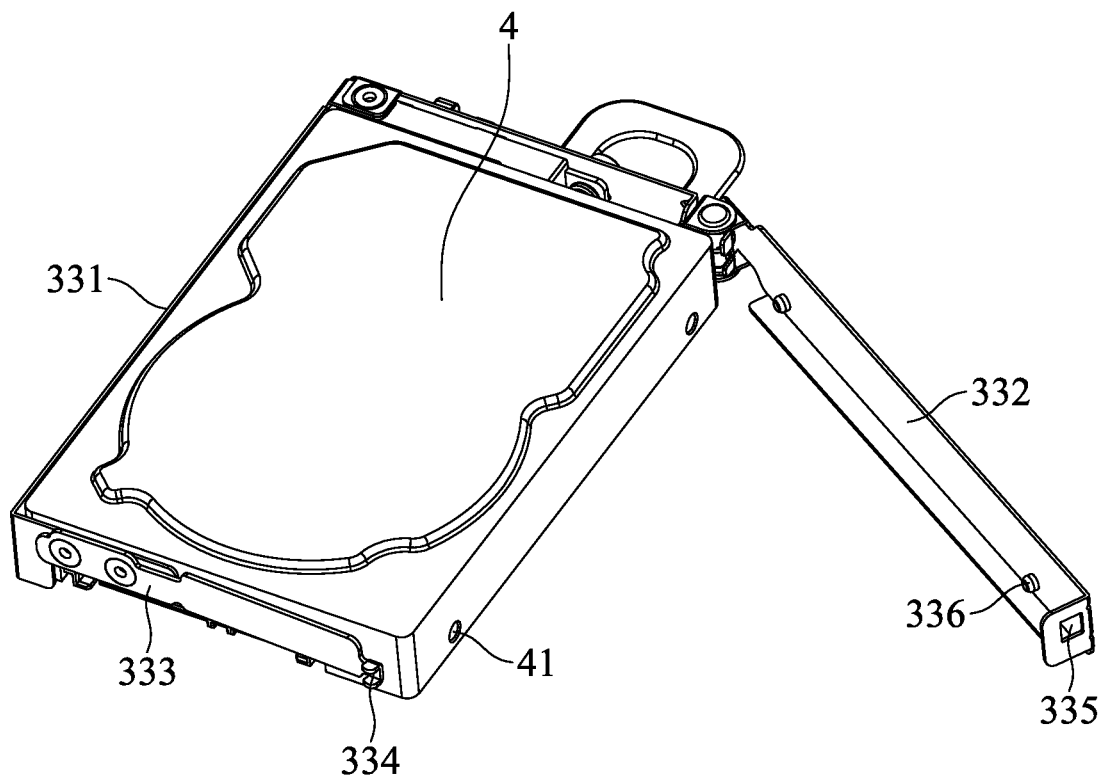

With reference to FIGS. 4C and 4D, in one embodiment, the U-shaped member 331 includes an elastic arm 333. The free end of the elastic arm 333 comprises an elastic arm wedging portion 334. The side member 332 comprises a side member wedging portion 335. The side member wedging portion 335 is detachably connected to the elastic arm wedging portion 334. In this embodiment, the side member wedging portion 335 can be separated from the elastic arm wedging portion 334 by slightly pressing the elastic arm 333.

With reference to FIG. 4D, in one embodiment, the carried unit 4 comprises a plurality of thread holes 41. The module frame 3 comprises a plurality of frame protrusions 336. At least one of the frame protrusions (not shown) is formed on the U-shaped frame 331. At least one of the frame protrusions 336 is formed on the side member 332, and the frame protrusions 336 wedge the thread holes 41.

In the embodiment of the invention, the module frame 3 wedges the thread holes 41 on the surface of the carried unit 4 (such as hard disk). The module frame 3 can be affixed to the carried unit 4 (such as hard disk) without screws. The carried unit 4 (such as hard disk) therefore can be easily removed from the module frame 3 without additional tools (such as screw driver).

With reference to FIG. 3A, in one embodiment, the module frame 332 further comprises a shaft 337 and a torsion spring 338. The side member 332 pivots on the U-shaped member 331 via the shaft 337. The torsion spring 338 is telescoped on the shaft 337. One end of the torsion spring 338 abuts the side member 332, and the other end of the torsion spring 338 abuts the U-shaped frame 331. The torsion spring 338 provides a torsion force. When the elastic arm wedging portion 334 releases the side member wedging portion 335, the side member 332 is rotated by the torsion force automatically. With reference to FIG. 1, in this embodiment, the user can remove the module frame 3 and the carried unit 4 from the bracket 1 by pulling the module frame 3.

Figure 5A:
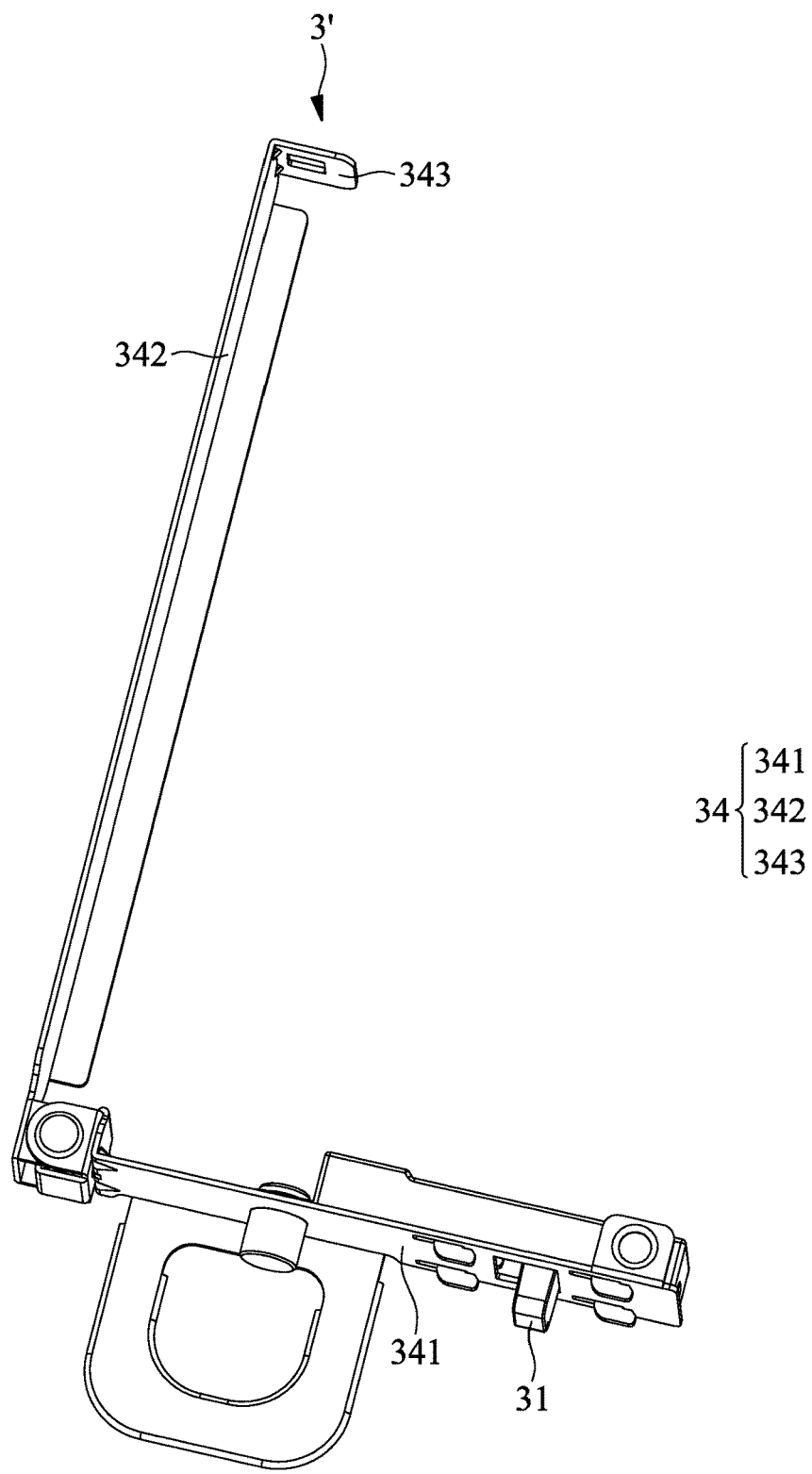
FIG. 5A shows a module frame of another embodiment of the invention.
Figure 5B:
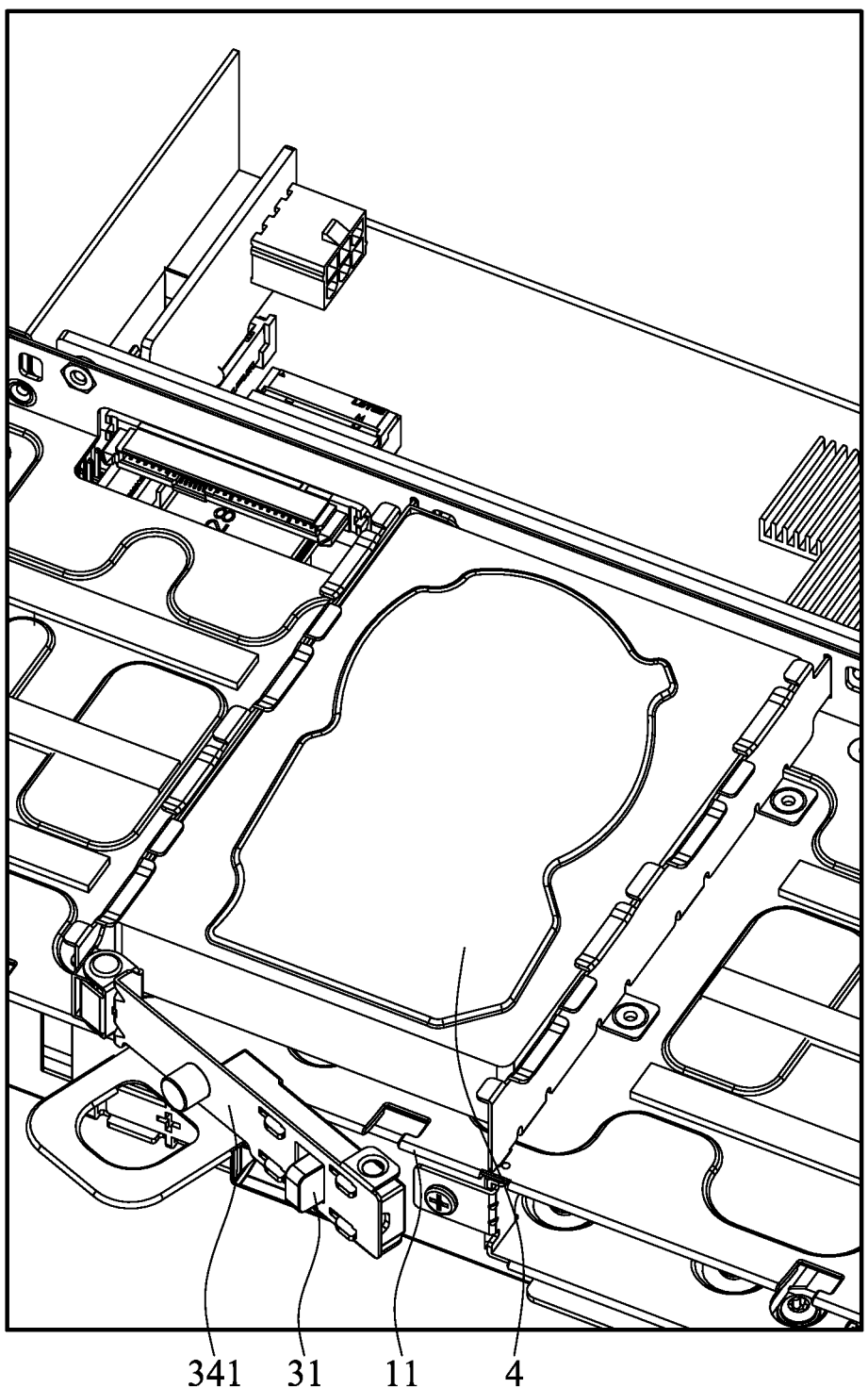
FIGS. 5B and 5C show the module frame being pulled out from the bracket of the embodiment of FIG. 5A of the invention.
Figure 5C:
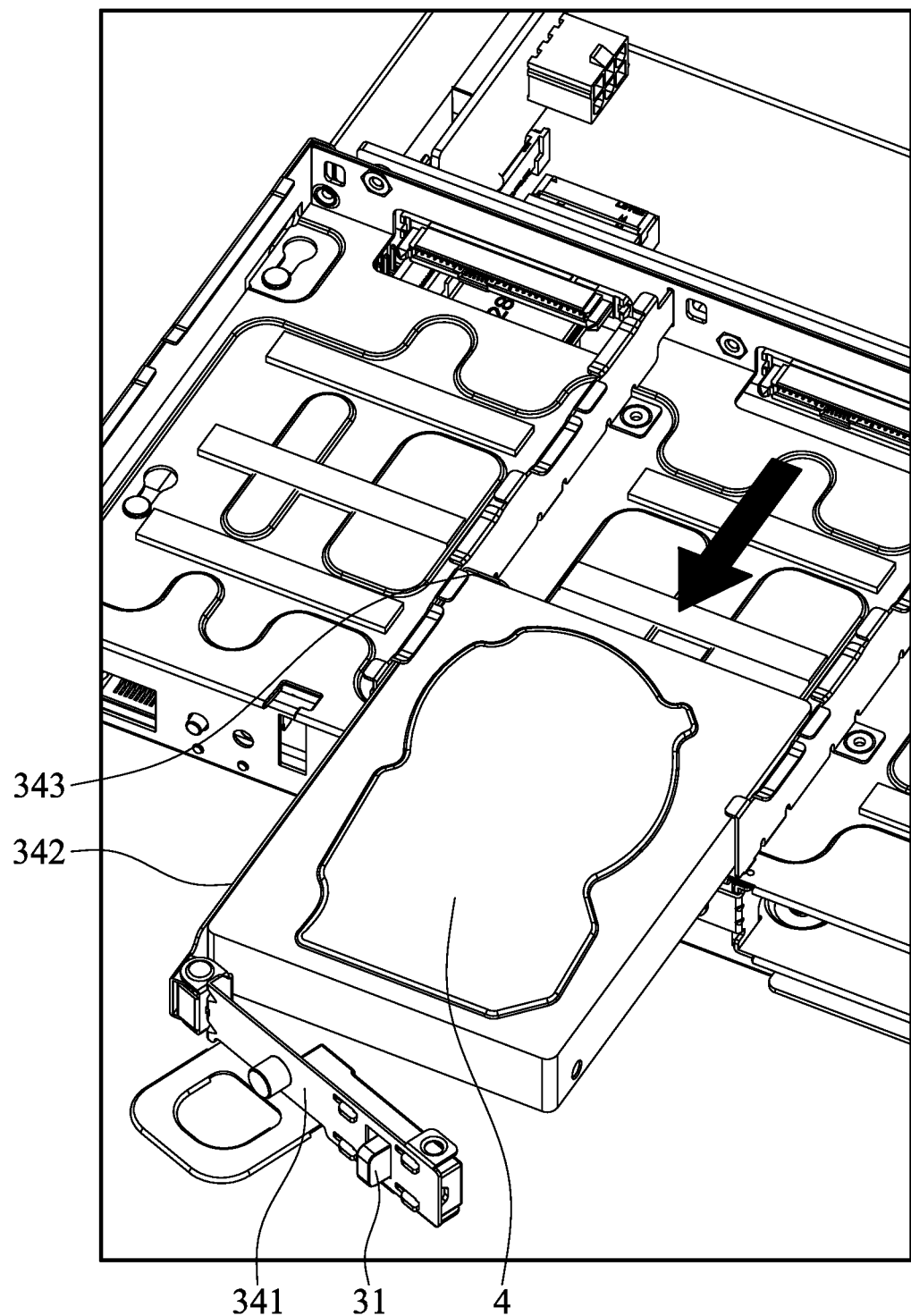

With reference to FIGS. 5A, 5B and 5C, in other embodiment, the module frame 3' comprises an L-shaped member 34. The L-shaped member 34 comprises a first section 341, a second section 342 and an abutting portion 343. The frame latch 31 is disposed on the first section 341, one end of the second section 342 pivots on the first section 341, the abutting portion 343 is formed on the other end of the second section 342, and the abutting portion 343 is perpendicular to the second section 342. Similar to the embodiment above, in one embodiment, the carried unit 4 comprises a plurality of thread holes, the module frame 3' comprises a plurality of frame protrusions, at least one of the frame protrusions is formed on the second section 342, and the frame protrusions wedge the thread holes.

Figure 5D:
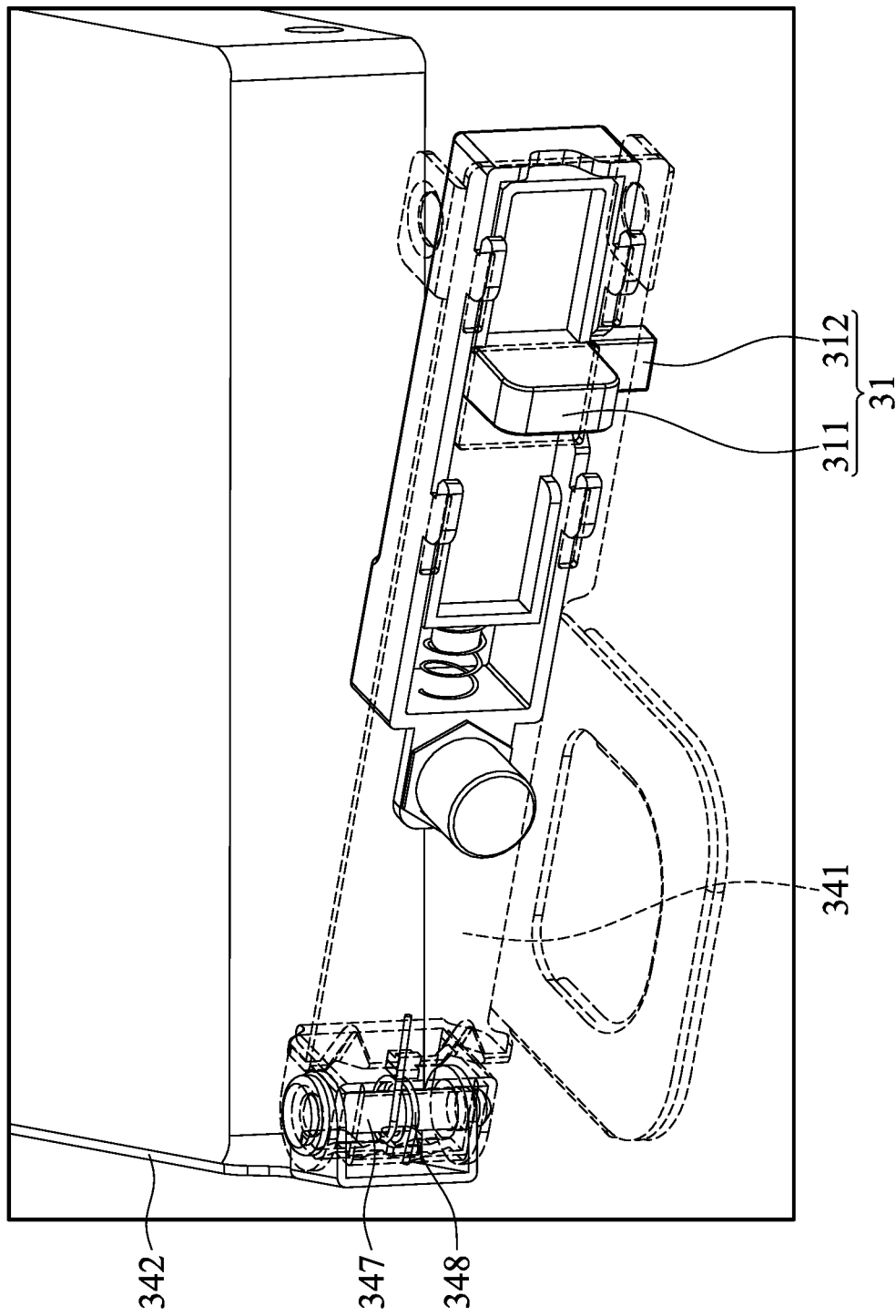
FIG. 5D shows a torsion spring of the embodiment of FIG. 5A of the invention.

With reference to FIG. 5D, similar to the embodiment above, in one embodiment, the second section 342 pivots on the first section 341 via a shaft 347. A torsion spring 348 is telescoped on the shaft 347. One end of the torsion spring 348 abuts the second section 342. The other end of the torsion spring 348 abuts the first section 341. The torsion spring 348 provides a torsion force. When the frame latch wedging portion 312 releases the bracket wedging portion 11, the first section 341 is rotated by the torsion force automatically (with reference to FIG. 5B).

With reference to FIGS. 5B and 5C, the abutting portion 343 abuts the carried unit 4, and the abutting portion 343 can be pushed by the carried unit 4. Therefore, after the first section 341 is rotated by the torsion force automatically, the user can remove the module frame 3' and the carried unit 4 from the bracket 1 by pulling the first section 341.

With reference to FIG. 1, in one embodiment, the bracket 1 comprises a first plate 131, a second plate 132 and two spacers 133. The first plate 131 is perpendicular to the second plate 132. The bracket wedging portion 11 is disposed on the first plate 131. The connector 2 is disposed on the second plate 132. The spacers 133 are perpendicular to the first plate 131 and perpendicular to the second plate 132. The receiving recess 12 is defined between the spacers 133. Each spacer 133 comprises at least one restriction portion 134. The restriction portion 134 corresponds to the first plate 131 (in this embodiment, the restriction portion 134 is parallel to the first plate 131). The spacers 133 (including the restriction portions 134) restrict the freedom the carried unit 4, and the carried unit 4 can be moved in a plugging and unplugging direction (as labeled by the arrow in FIG. 1).

With reference to FIG. 1, in one embodiment, the electronic device E further comprises a plurality of elastic strips 14. The elastic strips 14 are attached to the first plate 131 and adapted to abut the carried unit 4. The elastic strips 14 absorb the vibration and tolerance.

Figure 6A:
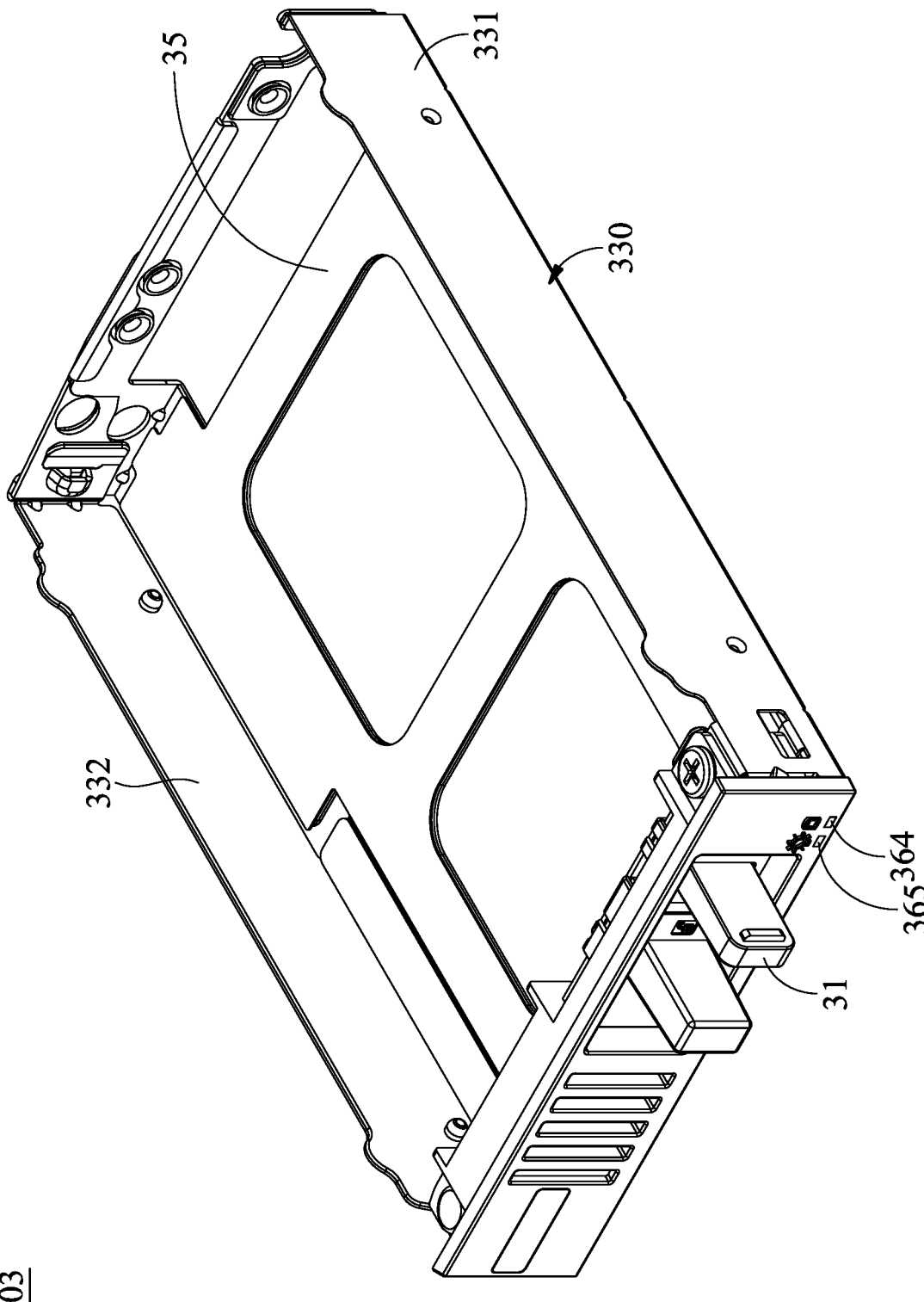
FIGS. 6A and 6B show a module frame of another embodiment of the invention.
Figure 6B:
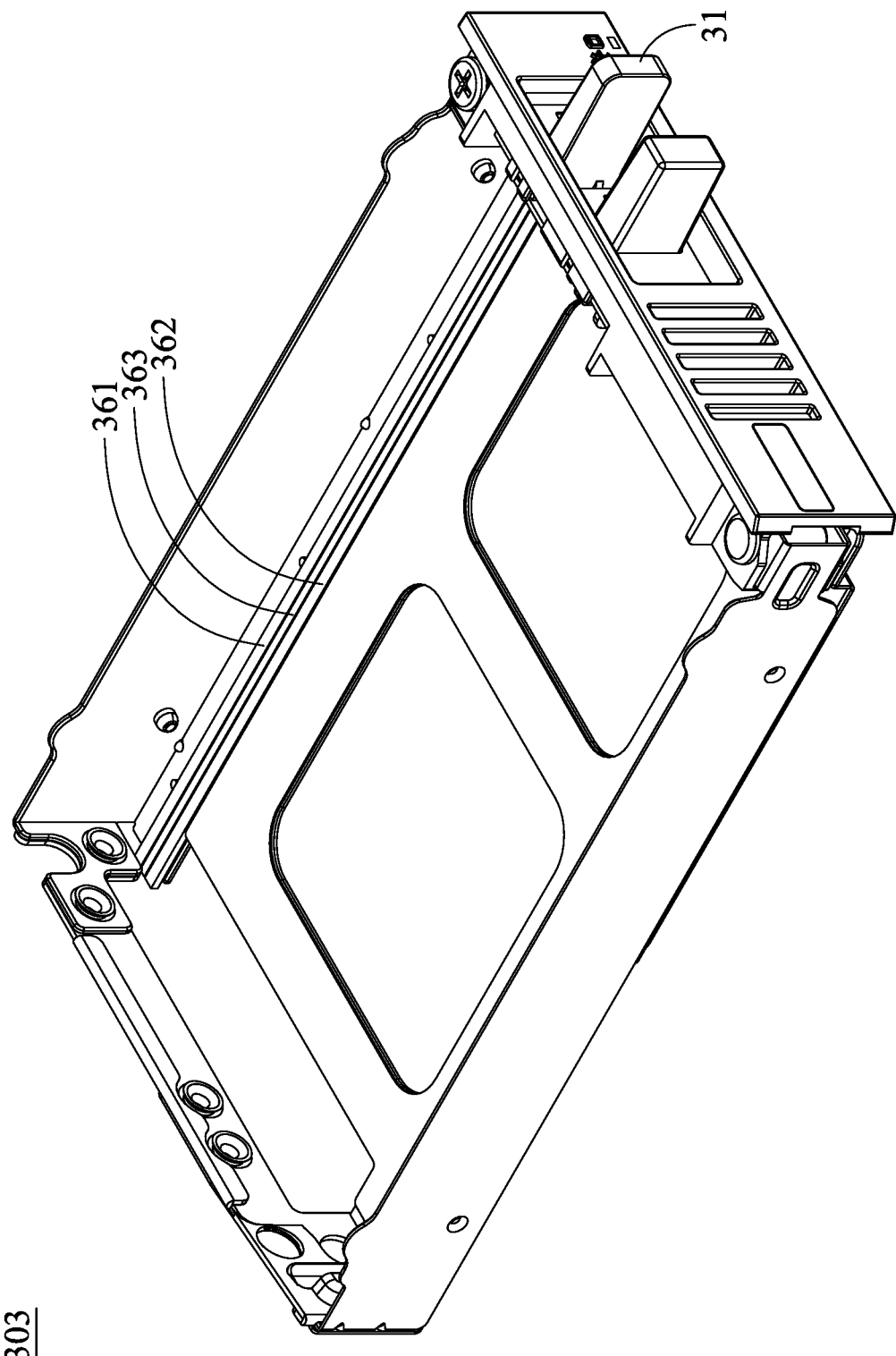

FIGS. 6A and 6B show a module frame of another embodiment of the invention. With reference to FIGS. 6A and 6B, the module frame 303 is for carrying a carried unit and being detachably connected to a bracket of an electronic device. The module frame 303 comprises a frame body 330, a frame latch 31 and a supporting plate 35. The frame latch 31 is disposed on the frame body 330. The supporting plate 35 is connected to the frame body 330. Similar to the embodiment above, in a fastened state, the frame latch wedges the bracket. In a released state, the frame latch is separated from the bracket. The supporting plate 35 increases the strength of the module frame 303.

With reference to FIGS. 6A and 6B, similar to the embodiment above, in one embodiment, the frame body 330 comprises a U-shaped member 331 and a side member 332. One end of the side member 332 pivots on one end of the U-shaped member 331. The other end of the side member 332 is detachably connected to the other end of the U-shaped member 331. The frame latch 31 is disposed on the U-shaped member 331. In this embodiment, the supporting plate 35 is connected to the U-shaped member 331.

With reference to FIGS. 6A and 6B, in one embodiment, the module frame 303 further comprises a first light guide strip 361, wherein the first light guide strip 361 is disposed on the supporting plate 35, and is located between the carried unit and the supporting plate 35. In one embodiment, the module frame 303 further comprises a second light guide strip 362 and a light blocking strip 363. The second light guide strip 362 and the light blocking strip 363 are disposed on the supporting plate 35. The second light guide strip 362 and the light blocking strip 363 are located between the carried unit and the supporting plate 35. The light blocking strip 363 is located between the first light guide strip 361 and the second light guide strip 362. The light blocking strip 363 prevents the light in the first light guide strip 361 from being mixed with the light in the second light guide strip 362.

In one embodiment, the light blocking strip 363 can be rubber strip. The first light guide strip 361 and the second light guide strip 362 can be acrylic strips.

With reference to FIGS. 6A and 6B, the first light guide strip 361 and the second light guide strip 362 respectively provide lights for a first light output port 364 and a second light output port 365. The first light guide strip 361 and the second light guide strip 362 respectively correspond to a first light source and a second light source. The first light source and the second light source are disposed on a transfer board behind the module frame 303. In this embodiment, the light strip is located between the carried unit and the supporting plate 35. The space inside the electronic device can be sufficiently utilized, and the size of the electronic device can be reduced.

Figure 7A:
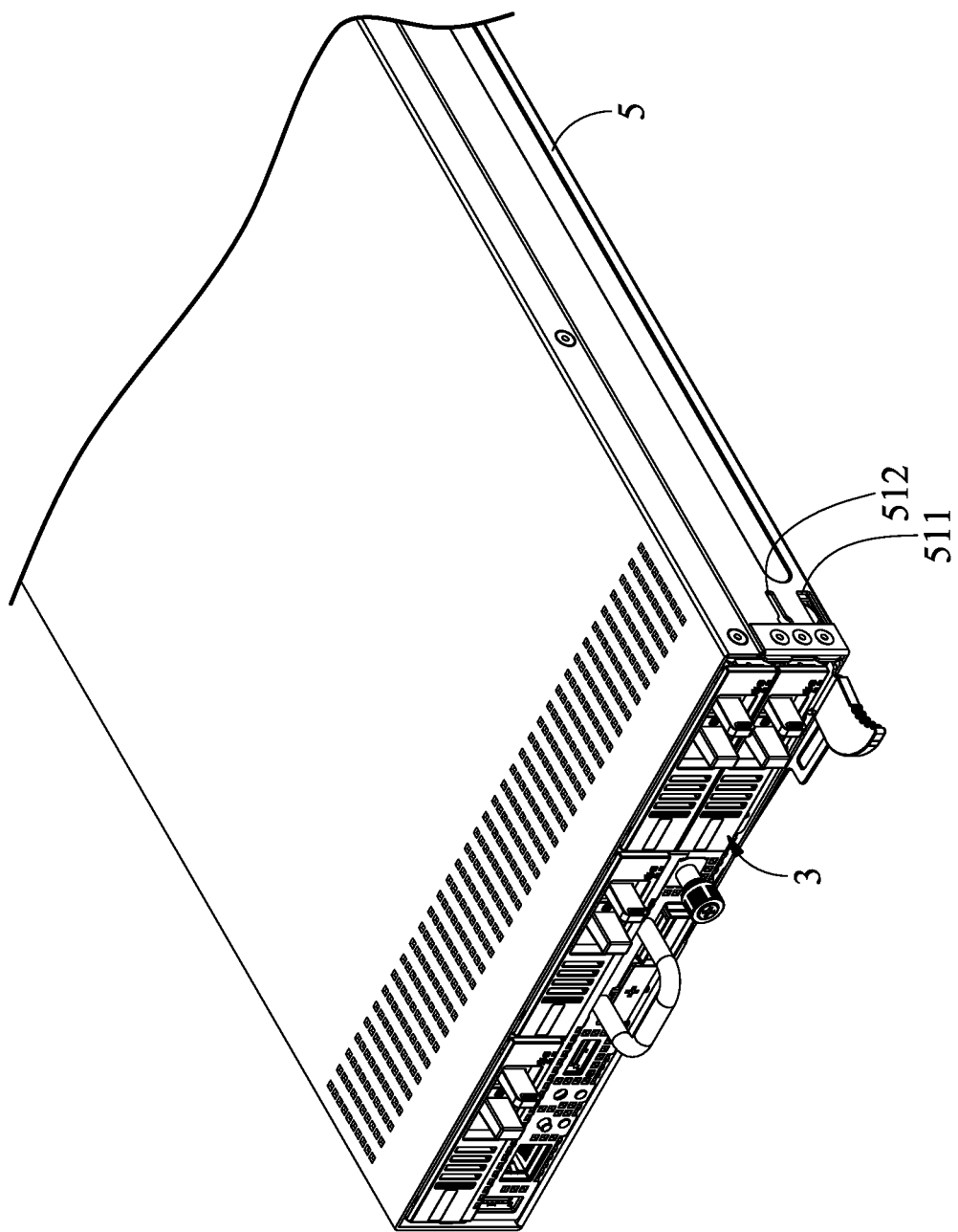
FIGS. 7A and 7B show another electronic device with a detachable structure of one embodiment of the invention.
Figure 7B:
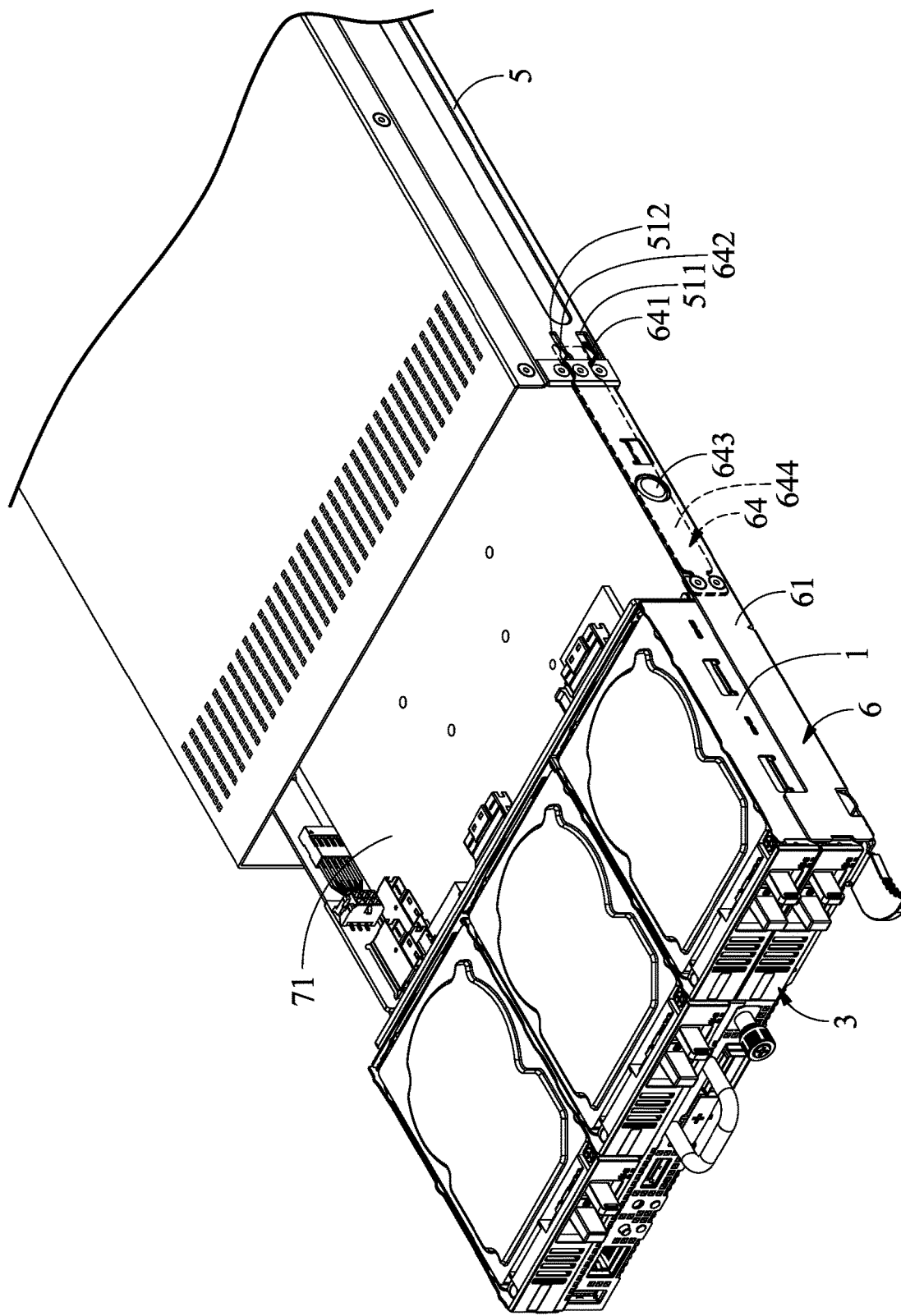

With reference to FIGS. 7A and 7B, in another embodiment, an electronic device with a detachable structure is provided. The electronic device comprises a housing 5 and a carrier plate 6. The housing 5 comprises a first wedging slot 511. The carrier plate 6 is detachably connected to the housing 5. The carrier plate 6 comprises a carrier plate body 61 and a carrier plate latch 62. The carrier plate latch 62 is disposed on the carrier plate body 61. In this embodiment, the carrier plate latch 62 is disposed on the inner side of the carrier plate body 61.

In one embodiment, the electronic device further comprises a mainboard 71, wherein the mainboard 71 is disposed on the carrier plate body 61. Additionally, the bracket 1 and the module frame 3 are disposed on the carrier plate body 61.

Figure 8A:
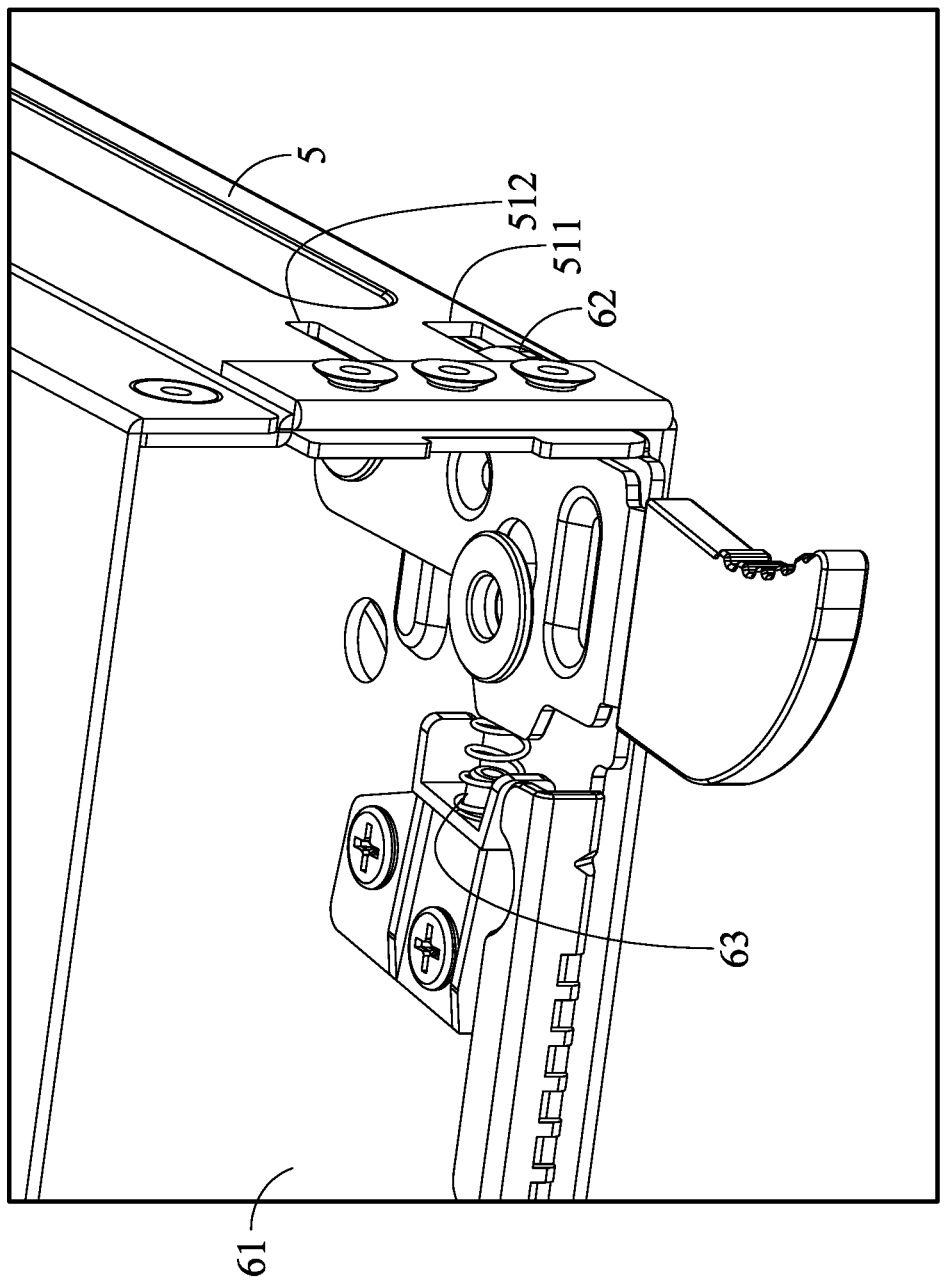
FIG. 8A shows the details of a carrier plate latch of one embodiment of the invention, wherein the carrier plate latch is in a first carrier plate latch position.
Figure 8B:
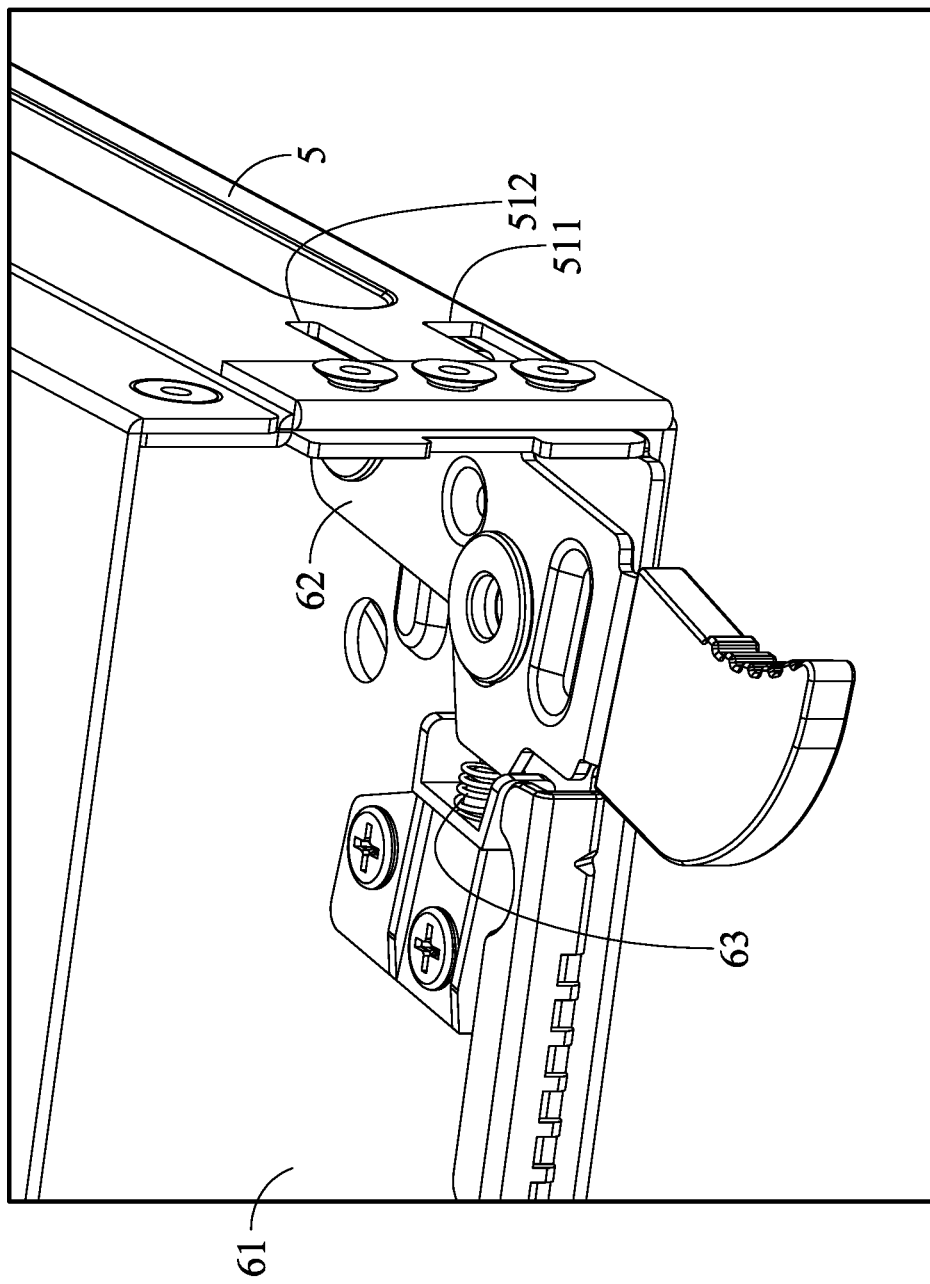
FIG. 8B shows the details of the carrier plate latch of the embodiment of FIG. 8A of the invention, wherein the carrier plate latch is in a second carrier plate latch position.

With reference to FIGS. 8A and 8B, the carrier plate latch 62 is moved between a first carrier plate latch position (FIG. 8A) and a second carrier plate latch position (FIG. 8B). When the carrier plate latch 62 is in the first carrier plate latch position, the carrier plate latch 62 wedges the first wedging slot 511. When the carrier plate latch 62 is in the second carrier plate latch position, the carrier plate latch 62 is separated from the first wedging slot 511. In this embodiment, the carrier plate latch 62 pivots between the first carrier plate latch position and the second carrier plate latch position.

With reference to FIGS. 8A and 8B, in one embodiment, the carrier plate 6 further comprises an elastic recovering unit 63. The elastic recovering unit 63 is disposed on the carrier plate body 61. When the carrier plate latch 62 is in the second carrier plate latch position, the elastic recovering unit 63 provides an elastic force to the carrier plate latch 62 to move the carrier plate latch 62 back to the first carrier plate latch position. The elastic recovering unit 63 can be a compression spring.

With reference to FIGS. 7A and 7B, in one embodiment, the carrier plate 6 further comprises at least one carrier plate elastic sheet 64. The carrier plate elastic sheet 64 is disposed on the carrier plate body 61. The carrier plate 6 is moved between a first carrier plate position (FIG. 7A) and a second carrier plate position (FIG. 7B) relative to the housing 5. When the carrier plate 6 is in the first carrier plate position, the carrier plate latch 62 wedges the first wedging slot 511. When the carrier plate 6 is in the second carrier plate position, the carrier plate 6 is partially out of the housing, and the carrier plate elastic sheet 64 wedges the first wedging slot 511. Therefore, the carrier plate 6 is prevented from being suddenly dropped, and the carried unit (such as hard disk) is prevented from damaged.

With reference to FIGS. 7A and 7B, in one embodiment, the carrier plate elastic sheet 64 comprises a first elastic sheet hook 641. One end of the carrier plate elastic sheet 64 is connected to the carrier plate body 61. The first elastic sheet hook 641 is disposed on the other end of the carrier plate elastic sheet 64. When the carrier plate 6 is in the second carrier plate position, the first elastic sheet hook 641 wedges the first wedging slot 511.

With reference to FIGS. 7A and 7B, in one embodiment, the housing 5 further comprises a second wedging slot 512. The carrier plate elastic sheet 64 comprises a second elastic sheet hook 642. When the carrier plate 6 is in the first carrier plate position, the second wedging slot is empty. When the carrier plate 6 is in the second carrier plate position, the second elastic sheet hook 642 wedges the second wedging slot 512.

The carrier plate elastic sheet 64 can be formed on one single side or both sides of the carrier plate body 61 to wedge to the first wedging slot 511 and to prevent the carrier plate 6 from being suddenly dropped. When the carrier plate 6 is in the second carrier plate position, the maintainer can press the carrier plate elastic sheet 64 to separate the first elastic sheet hook 641 from the first wedging slot 511, and to separate the second elastic sheet hook 642 from the second wedging slot 512. The carrier plate 6 is therefore separated from the housing 5. In one embodiment, the carrier plate elastic sheet further comprises an elastic sheet pressing portion 643. The elastic sheet pressing portion 643 protrudes from an elastic sheet surface 644 of the carrier plate elastic sheet 64. The maintainer therefore can touch the elastic sheet pressing portion 643 easily.

The carrier plate elastic sheet 64 can be formed on the inner side or the outer side of the carrier plate body 61. With reference to FIGS. 7A and 7B, in one embodiment, the carrier plate elastic sheet 64 is located on the inner side of the carrier plate body 61. The lateral wall of the carrier plate body 61 has a plurality of through holes. The carrier plate latch 62, the first elastic sheet hook 641, the second elastic sheet hook 642 and the elastic sheet pressing portion 643 are adapted to pass through the through holes and protrude from the lateral side of the carrier plate body 61.

Figure 9A:
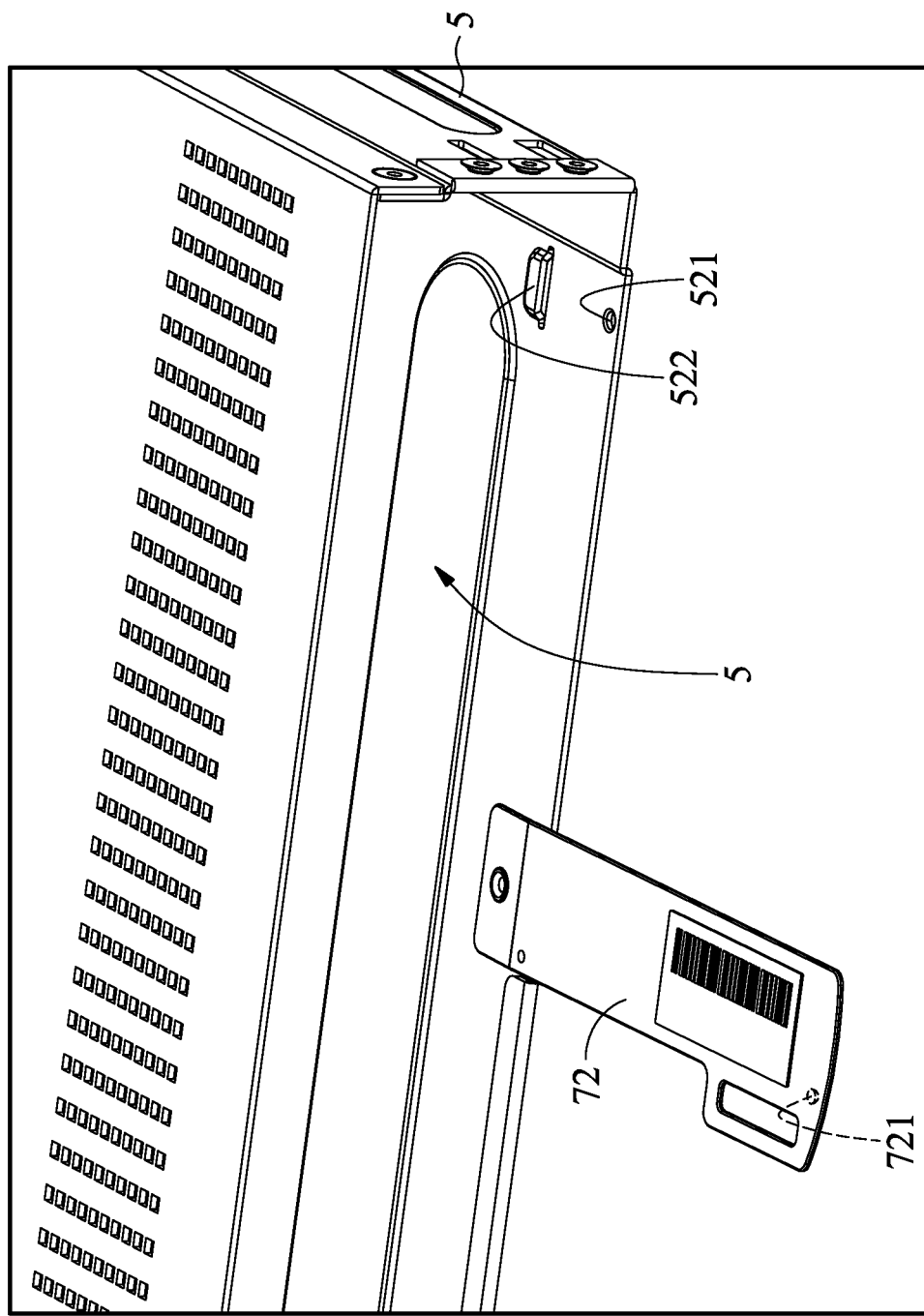
FIGS. 9A and 9B show a label carrier of an embodiment of the invention.
Figure 9B:
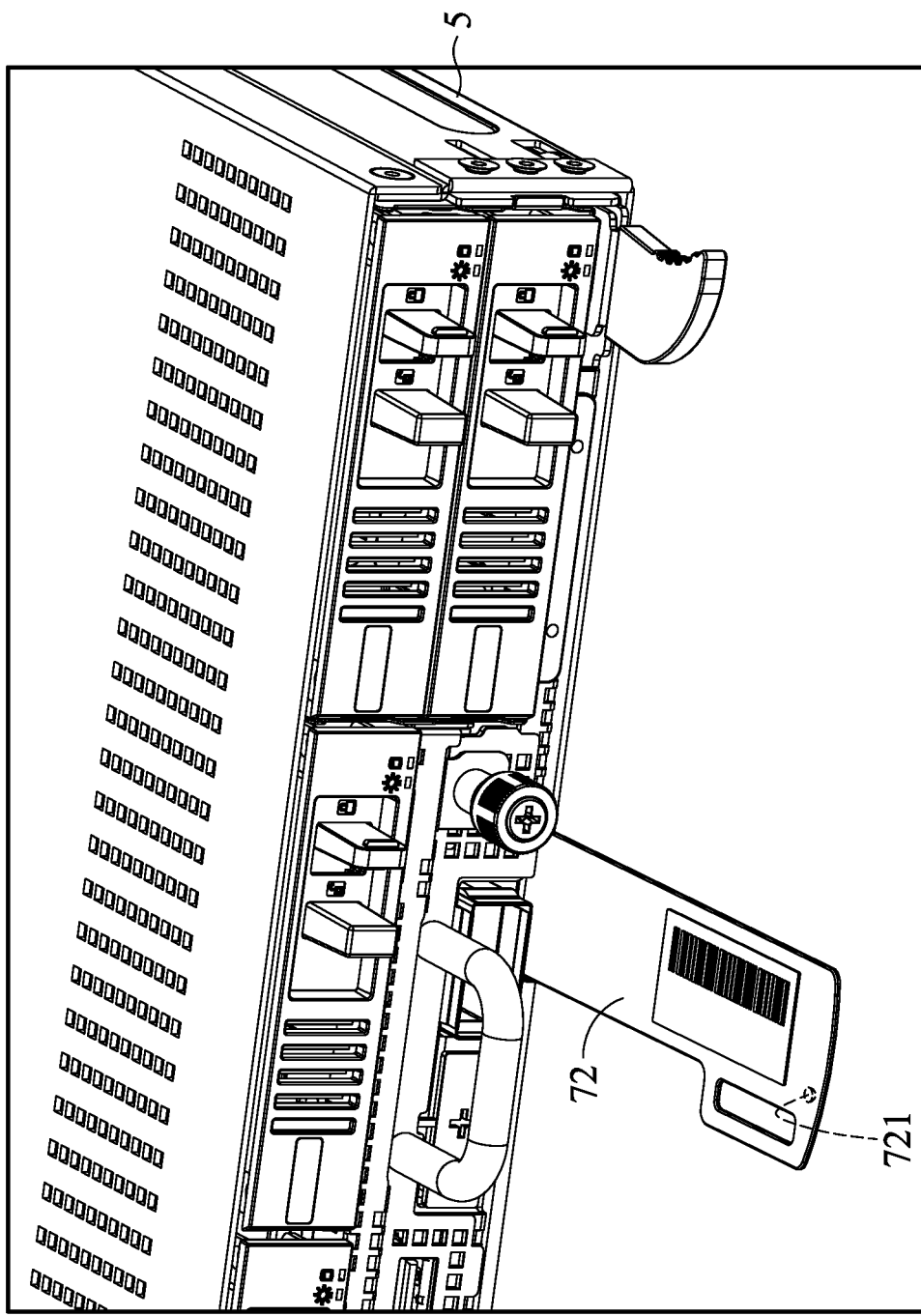

With reference to FIGS. 9A and 9B, in one embodiment, the electronic device further comprises a label carrier 72. The label carrier 72 is disposed in the housing 5, and is located between the housing 5 and the carrier plate 6. In this embodiment, the label carrier 72 pivots on the housing 5.

With reference to FIGS. 9A and 9B, in one embodiment, the label carrier 72 comprises at least one positioning protrusion 721, the housing 5 comprises at least one positioning recess 521. The positioning protrusion 721 is adapted to be wedged to the positioning recess 521 to restrict the orientation of the label carrier 72. The housing 5 can further comprise a positioning block 522, and the positioning block 522 is also utilized for restricting the orientation of the label carrier 72.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with detachable structure, comprising:
   a bracket, comprising a bracket wedging portion and a notch, wherein the bracket has a receiving recess, the receiving recess has a first side and a second side, the first side is opposite to the second side, and the bracket wedging portion and the notch are adjacently disposed on a front-facing edge on the first side;
   a connector, disposed on the second side of the bracket;
   a module frame, detachably connected to the bracket, wherein the module frame comprises a frame latch arranged to be linearly moveable between a first position and a second position, arranged such that when the module frame is in the receiving recess and the frame latch is moved to the first position, the frame latch wedges the bracket wedging portion such that the module frame is in a fastened state, and when the module frame is in the receiving recess and the frame latch is moved to the second position, the frame latch is separated from the bracket wedging portion such that the module frame is in a released state adapted to be separated from the receiving recess; and a carried unit, disposed in the module frame, wherein in the fastened state, the carried unit is connected to the connector;

wherein the frame latch comprises a rod portion and a frame latch wedging portion, the module frame further comprises a frame latch chamber, the frame latch is partially located in the frame latch chamber and is adapted to be moved in the frame latch chamber, wherein the frame latch wedging portion has a frame latch inclined surface, arranged such that as the module frame is pressed into the receiving recess, the bracket wedging portion pushes the frame latch inclined surface so as to drive the frame latch wedging portion into the notch, drive the frame latch toward the second frame latch position and compress an elastic element inside the frame latch chamber, wherein when the frame latch inclined surface passed the bracket wedging portion, the elastic element provides an elastic force on the frame latch to move the frame latch back to the first frame latch position.

2. The electronic device as claimed in claim 1, wherein the module frame comprises a U-shaped member and a side member, one end of the side member pivots on one end of the U-shaped member, the other end of the side member is detachably connected to the other end of the U-shaped member, and the frame latch is disposed on the U-shaped member.

3. The electronic device as claimed in claim 2, wherein the U-shaped member includes an elastic arm, a free end of the elastic arm comprises an elastic arm wedging portion, the side member comprises a side member wedging portion, and the side member wedging portion is detachably connected to the elastic arm wedging portion.

4. The electronic device as claimed in claim 2, wherein the carried unit comprises a plurality of thread holes, the module frame comprises a plurality of frame protrusions, at least one of the frame protrusions is formed on the U-shaped frame, at least one of the frame protrusions is formed on the side member, and the frame protrusions wedge the thread holes.

5. The electronic device as claimed in claim 2, wherein the module frame further comprises a shaft and a torsion spring, the side member pivots on the U-shaped member via the shaft, the torsion spring is telescoped on the shaft, one end of the torsion spring abuts the side member, and the other end of the torsion spring abuts the U-shaped frame.

6. The electronic device as claimed in claim 1, wherein the module frame comprises an L-shaped member, the L-shaped member comprises a first section, a second section and an abutting portion, the frame latch is disposed on the first section, one end of the second section pivots on the first section, the abutting portion is formed on the other end of the second section, the abutting portion is perpendicular to the second section, the carried unit comprises a plurality of thread holes, the module frame comprises a plurality of frame protrusions, at least one of the frame protrusions is formed on the second section, the frame protrusions wedge the thread holes, the module frame further comprises a shaft and a torsion spring, the second section pivots on the first section via the shaft, the torsion spring is telescoped on the shaft, one end of the torsion spring abuts the second section, and the other end of the torsion spring abuts the first section.

7. The electronic device as claimed in claim 1, wherein the bracket comprises a first plate, a second plate and two spacers, the first plate is perpendicular to the second plate, the bracket wedging portion is disposed on the first plate, the connector is disposed on the second plate, the spacers are perpendicular to the first plate and perpendicular to the second plate, the receiving recess is defined between the spacers, each spacer comprises at least one restriction portion, and the restriction portion corresponds to the first plate.

8. The electronic device as claimed in claim 7, further comprising a plurality of elastic strips, wherein the elastic strips are attached to the first plate and adapted to abut the carried unit.

9. The electronic device as claimed in claim 1, wherein the frame latch is located on an exposed side of the module frame opposite to the connector when the carried unit is in the fastened state.

10. The electronic device as claimed in claim 9, wherein the rod portion extends through a slot in the exposed side of the module frame in a direction away from the connector and is exposed from the module frame when the carried unit is in the fastened state.

11. The electronic device as claimed in claim 9, wherein the slot and frame latch are arranged such that reciprocating movement of the rod portion drives the frame latch between the first position and the second position.

* * * * *